(12) United States Patent
Allen et al.

(10) Patent No.: US 7,057,415 B2
(45) Date of Patent: Jun. 6, 2006

(54) OUTPUT BUFFER COMPENSATION CONTROL

(75) Inventors: Andrew R. Allen, Fort Collins, CO (US); Barry J. Arnold, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 193 days.

(21) Appl. No.: 10/732,695

(22) Filed: Dec. 10, 2003

(65) Prior Publication Data

US 2005/0127939 A1 Jun. 16, 2005

(51) Int. Cl.
*H03K 19/175* (2006.01)

(52) U.S. Cl. .............. 326/82; 326/30; 326/26
(58) Field of Classification Search .......... 326/26, 326/27, 30, 82–87
See application file for complete search history.

(56) References Cited

U.S. PATENT DOCUMENTS

| | | | |
|---|---|---|---|
| 5,606,275 A | 2/1997 | Farhang et al. | |
| 5,955,894 A | 9/1999 | Vishwanthaiah et al. | |
| 6,060,907 A | 5/2000 | Vishwanthaiah et al. | |
| 6,085,033 A | 7/2000 | Starr et al. | |
| 6,114,885 A | 9/2000 | Yang et al. | |
| 6,115,298 A | 9/2000 | Kwon et al. | |
| 6,118,310 A | 9/2000 | Esch, Jr. | |
| 6,236,695 B1 | 5/2001 | Taylor | |
| 6,255,874 B1 | 7/2001 | Shay | |
| 6,316,957 B1 | 11/2001 | Ang et al. | |
| 6,326,802 B1 * | 12/2001 | Newman et al. | 326/30 |
| 6,380,758 B1 * | 4/2002 | Hsu et al. | 326/30 |
| 6,384,621 B1 * | 5/2002 | Gibbs et al. | 326/30 |
| 6,418,500 B1 | 7/2002 | Gai et al. | |
| 6,420,913 B1 | 7/2002 | Ang et al. | |
| 6,424,175 B1 | 7/2002 | Vangal et al. | |
| 6,426,651 B1 * | 7/2002 | Mandal et al. | 326/63 |
| 6,429,679 B1 | 8/2002 | Kim et al. | |
| 6,459,320 B1 | 10/2002 | Lee | |
| 6,469,539 B1 | 10/2002 | Kim | |
| 6,509,757 B1 | 1/2003 | Humphrey | |
| 6,509,780 B1 | 1/2003 | Lim et al. | |
| 6,525,558 B1 * | 2/2003 | Kim et al. | 326/30 |
| 6,535,047 B1 | 3/2003 | Mughal et al. | |
| 6,545,522 B1 | 4/2003 | Mughal et al. | |
| 6,556,038 B1 | 4/2003 | Kim et al. | |
| 6,563,337 B1 | 5/2003 | Dour | |
| 6,566,903 B1 | 5/2003 | Mandal et al. | |
| 6,570,402 B1 | 5/2003 | Koo et al. | |
| 6,573,746 B1 | 6/2003 | Kim et al. | |
| 6,573,747 B1 | 6/2003 | Radhakrishnan | |
| 6,608,506 B1 | 8/2003 | Ang et al. | |
| 6,624,662 B1 * | 9/2003 | Volk | 326/87 |
| 6,894,547 B1 * | 5/2005 | Takahashi | 327/170 |
| 2002/0135406 A1 | 9/2002 | Hossain et al. | |
| 2002/0186066 A1 | 12/2002 | Soda | |

(Continued)

OTHER PUBLICATIONS

Gabara, Thaddeus J., et al., "Forming Damped LRC Parasitic Circuits in Simultaneously Switched CMOS Output Buffers," IEEE Journal of Solid-State Circuits, vol. 32, No. 3, pp. 407-418 (Mar. 1997).

(Continued)

*Primary Examiner*—Don Le

(57) ABSTRACT

One or more characteristics of circuitry for an output buffer are identified relative to a reference a plurality of times to produce a sequence of results. One or more compensation signals for one or more output buffers are generated based on results satisfying one or more conditions.

26 Claims, 7 Drawing Sheets

U.S. PATENT DOCUMENTS

2003/0062920 A1    4/2003    Radhakrishnan
2003/0218914 A1    11/2003   Kim et al.

OTHER PUBLICATIONS

Ilkbahar, Alper, et al., "Itanium(TM) Processor System Bus Design," IEEE Journal of Solid-State Circuits, vol. 36, No. 10, pp. 1565-1573 (Oct. 2001).

Kim, Su-Chul, et al., "Programmable Digital On-Chip Terminator", Proceedings of the 2002 International Technical Conference on Circuits/Systems, Computers and Communications (ITC-CSCC), 4 pages (Jul. 16-19, 2002).

Koo, Kyoung-Hoi, et al., "A New Impedance Control Circuit for USB2.0 Transceiver," Proceedings of the 27th European Solid-State Circuits Conference (ESSCIRC), 4 pages (Sep. 18-20, 2001).

Koo, Kyoung-Hoi, et al., "A New Impedance Control Circuit for USB2.0 Transceiver," 27th European Solid-State Circuits Conference (ESSCIRC), 16 page slide presentation (Sep. 18-20, 2001).

* cited by examiner

OUTPUT BUFFER COMPENSATION CONTROL

BACKGROUND ART

One integrated circuit (IC) has output buffers to transmit data signals, for example, onto input/output (I/O) lines of a bus for reception by another IC coupled to the bus. The speed or frequency at which such signals may be reliably transmitted and received on a line depends at least in part, for example, on how well the line is terminated to avoid signal reflections on the line. An IC at an end of a line may use an output buffer having an on-die termination impedance that approximates the characteristic impedance of the line to help avoid signal reflections.

The speed or frequency at which such signals may be reliably transmitted and received on a line also depends at least in part, for example, on the slew rate, that is the rate of voltage change, with which the signals are driven. An IC driving signals at too fast of a slew rate for a given bus frequency may introduce noise on the line and therefore limit the ability of a receiving IC to interpret the signals properly. An IC driving signals at too slow of a slew rate for a given bus frequency may also limit the ability of a receiving IC to interpret signals properly as changing signals may not sufficiently transition from one voltage level to another within the time period in which the receiving IC is to interpret signals.

Because the termination impedance of an output buffer and the slew rate with which the output buffer drives signals can vary due to, for example, variations in process, supply voltage, and/or temperature (PVT variations) for the output buffer, IC's may be designed to drive signals at reduced frequencies to help more reliably transmit and receive signals in the presence of signal reflections and/or with varying slew rates. IC's may also be designed to control termination impedance and slew rates to help maintain them at substantially uniform levels in the presence of PVT variations. One IC controls an output buffer termination impedance and slew rate by controlling resistances affecting termination impedance and slew rate, respectively, relative to the relatively precise resistance of a resistor external to the IC.

SUMMARY

One disclosed method comprises identifying one or more characteristics of circuitry for an output buffer relative to a reference a plurality of times to produce a sequence of results, updating a count of results satisfying one or more conditions, and generating one or more compensation signals for one or more output buffers based on the count.

One disclosed method comprises identifying one or more characteristics of circuitry for an output buffer relative to a reference a plurality of times to produce a sequence of results and generating one or more compensation signals for one or more output buffers in response to a plurality of first results in the sequence having no more than a predetermined number of one or more second results between any two first results in the plurality.

One disclosed apparatus comprises circuitry for an output buffer, a reference comparator to identify one or more characteristics of the circuitry for an output buffer relative to a reference a plurality of times to produce a sequence of results, a filter to count results satisfying one or more conditions, and a compensation signal generator to generate one or more compensation signals for one or more output buffers based on the count.

One disclosed apparatus comprises circuitry for an output buffer, a reference comparator to identify one or more characteristics of the circuitry for an output buffer relative to a reference a plurality of times to produce a sequence of results, a filter to identify a plurality of first results in the sequence having no more than a predetermined number of one or more second results between any two first results in the plurality, and a compensation signal generator to generate one or more compensation signals for one or more output buffers in response to the identification of the plurality of first results.

One disclosed apparatus comprises means for identifying one or more characteristics of circuitry for an output buffer relative to a reference a plurality of times to produce a sequence of results, means for counting results satisfying one or more conditions, and means for generating one or more compensation signals for one or more output buffers.

One disclosed apparatus comprises means for identifying one or more characteristics of circuitry for an output buffer relative to a reference a plurality of times to produce a sequence of results and means for generating one or more compensation signals for one or more output buffers in response to a plurality of first results in the sequence having no more than a predetermined number of one or more second results between any two first results in the plurality.

One disclosed system comprises a bus comprising one or more lines and a plurality of devices coupled to the bus, wherein at least one device comprises one or more output buffers to output signals over one or more lines of the bus and a compensation controller to identify one or more characteristics of circuitry for an output buffer relative to a reference a plurality of times to produce a sequence of results and to generate one or more compensation signals for the one or more output buffers based on a count of results satisfying one or more conditions.

One disclosed system comprises a bus comprising one or more lines and a plurality of devices coupled to the bus, wherein at least one device comprises one or more output buffers to output signals over one or more lines of the bus and a compensation controller to identify one or more characteristics of circuitry for an output buffer relative to a reference a plurality of times to produce a sequence of results and to generate one or more compensation signals for the one or more output buffers in response to a plurality of first results in the sequence having no more than a predetermined number of one or more second results between any two first results in the plurality.

BRIEF DESCRIPTION OF DRAWINGS

One or more embodiments of the present invention are illustrated by way of example and not limitation in the figures of the accompanying drawings, in which like references indicate similar elements and in which.

DETAILED DESCRIPTION

Figure 1:
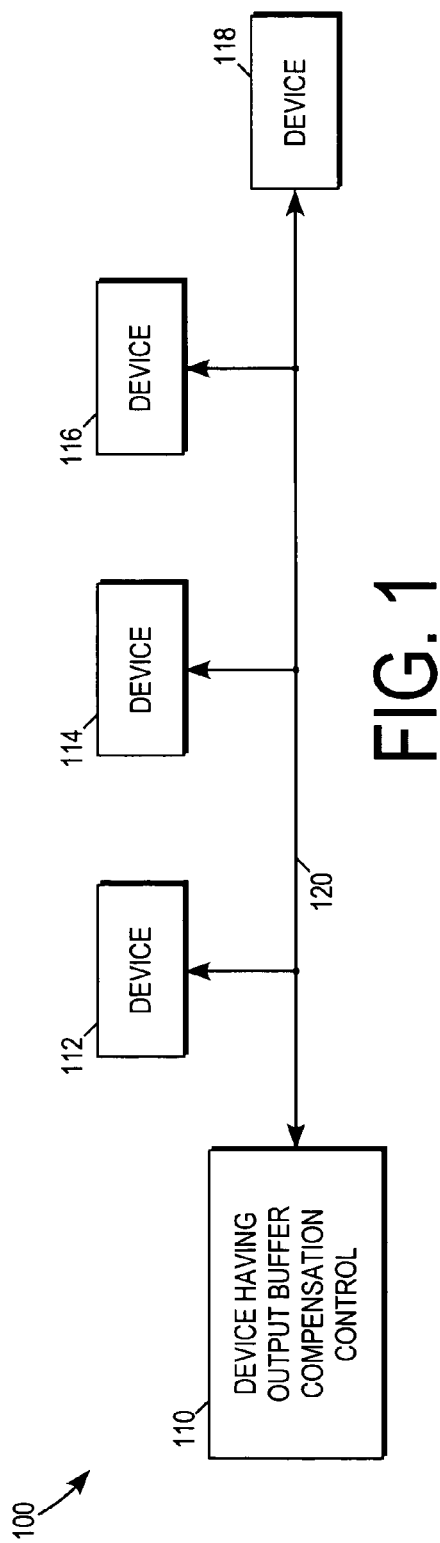
FIG. 1 illustrates, for one embodiment, an example system comprising a device having output buffer compensation control.

FIG. 1 illustrates, for one embodiment, an example system 100 comprising a plurality of devices 110, 112, 114, 116, and 118 coupled to a bus 120. Device 110, 112, 114, 116, and/or 118 may comprise any suitable circuitry to perform any suitable one or more functions and may comprise any suitable circuitry to transmit signals onto one or more input/output (I/O) lines of bus 120 and/or to receive signals from one or more lines of bus 120 in any suitable manner.

Figure 2:
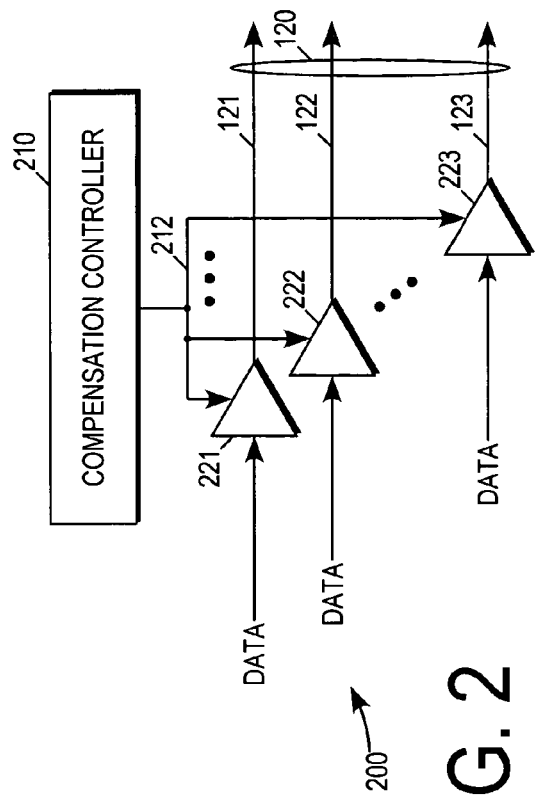
FIG. 2 illustrates, for one embodiment, a diagram of circuitry for a device having output buffer compensation control.

Device 110 has output buffer compensation control. Device 112, 114, 116, and/or 118 for one embodiment may also have output buffer compensation control similarly as device 110. As illustrated in FIG. 2, device 110 for one embodiment may comprise circuitry 200. Circuitry 200 for one embodiment may comprise compensation controller 210 and output buffers 221, 222, and 223.

Compensation controller 210 generates one or more compensation signals 212 and is coupled to output one or more compensation signals 212 to help control one or more characteristics of one or more of output buffers 221, 222, and 223. Compensation controller 210 may generate and output any suitable compensation signals 212 to help control any suitable one or more characteristics of any suitable one or more output buffers in any suitable manner to help compensate for any suitable one or more conditions. Compensation controller 210 for one embodiment may generate and output one or more compensation signals 212 to help control a termination impedance and/or a slew rate for one or more of output buffers 221, 222, and 223. Compensation controller 210 for one embodiment may generate and output one or more compensation signals 212 to help control one or more characteristics of one or more output buffers in the presence of process, supply voltage, and/or temperature (PVT) variations. Although illustrated as controlling one or more of three output buffers 221, 222, and 223, compensation controller 210 may be coupled to help control any suitable number of one or more output buffers.

Output buffers 221, 222, and 223 are each coupled to receive a data signal, for example, from other circuitry of device 110 and to drive a signal corresponding to the received data signal onto a respective line 121, 122, and 123 of bus 120. Although illustrated as having three output buffers 221, 222, and 223, device 110 may comprise any suitable number of one or more output buffers.

Figure 3:
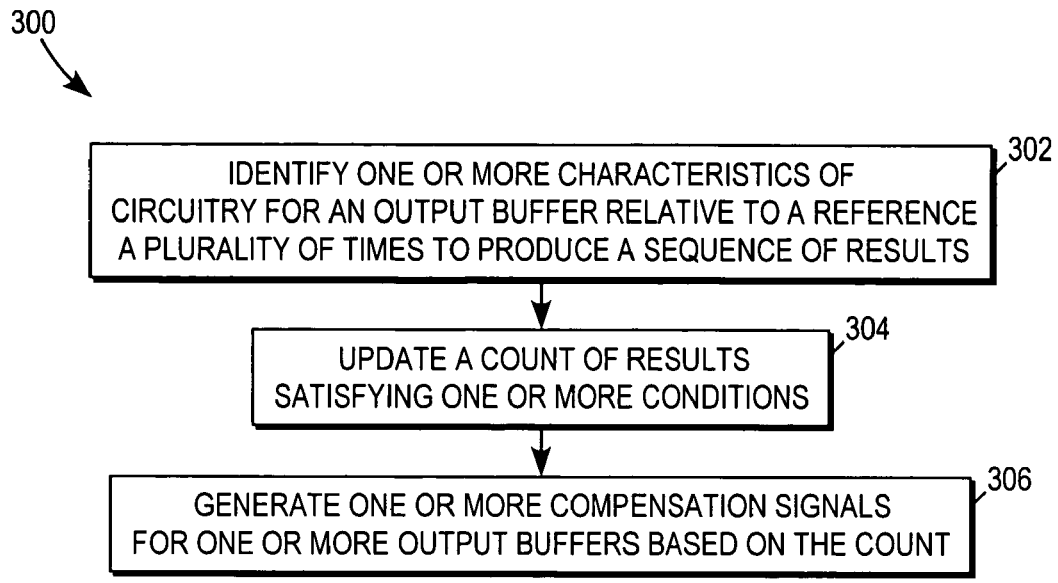
FIG. 3 illustrates, for one embodiment, a flow diagram for output buffer compensation control.

Compensation controller 210 for one embodiment may perform output buffer compensation control in accordance with a flow diagram 300 of FIG. 3.

For block 302 of FIG. 3, compensation controller 210 identifies one or more characteristics of circuitry for an output buffer relative to a reference a plurality of times to produce a sequence of results. Compensation controller 210 may identify any suitable one or more characteristics of any suitable circuitry for any suitable output buffer relative to any suitable reference in any suitable manner to produce a sequence of any suitable results.

Compensation controller 210 for one embodiment may compare the voltage level of an output signal from the circuitry for an output buffer relative to a reference voltage to produce a sequence of results helping to identify whether an impedance of the circuitry for an output buffer is greater than or less than a desired impedance.

Compensation controller 210 for one embodiment may identify a delay of the circuitry for an output buffer in generating a suitable signal relative to an amount of time defined by a suitable clock signal to produce a sequence of results helping to identify whether a slew rate of the circuitry for an output buffer is greater than or less than a desired slew rate.

For block 304, compensation controller 210 updates a count of results satisfying one or more conditions. Compensation controller 210 may update a count of any suitable results satisfying any suitable one or more conditions. Compensation controller 210 for one embodiment may update a count of consecutive results having a same value. Compensation controller 210 for one embodiment may update a count for a plurality of first results in the sequence having no more than a predetermined number of one or more second results between any two first results in the plurality. Compensation controller 210 for one embodiment may update a count of results satisfying one or more conditions to help identify whether the results are due to a relative condition of an output buffer characteristic or noise in compensation controller 210.

For block 306, compensation controller 210 generates one or more compensation signals 212 for one or more output buffers based on the count. Compensation controller 210 may generate any suitable one or more compensation signals 212 for any suitable one or more output buffers based on the count in any suitable manner. Compensation controller 210 for one embodiment may generate one or more compensation signals 212 in response to the count satisfying one or more conditions. Compensation controller 210 for one embodiment may generate one or more compensation signals in response to the count reaching or exceeding a predetermined number, for example.

Compensation controller 210 for one embodiment may control one or more output buffer characteristics in response to a count of at least a predetermined number of results identifying the same relative condition of one or more output buffer characteristics to help ensure such results were not due to noise and therefore to help avoid mistakenly controlling one or more output buffer characteristics.

Compensation controller 210 for one embodiment may generate one or more compensation signals 212 to help set and maintain the termination impedance of an output buffer to approximate the characteristic impedance of the line on which the output buffer drives signals. Compensation controller 210 for one embodiment may therefore help allow higher bus clock frequencies to be used with reduced or minimized concern for noise associated with signal reflections.

Compensation controller 210 for one embodiment may generate one or more compensation signals 212 to help set and maintain a slew rate of an output buffer at a desired level for the bus clock frequency with which signals are to be driven onto bus 120. Compensation controller 210 for one embodiment may help set and maintain the slew rate at or near a minimum allowable slew rate for the bus clock frequency with which signals are to be driven onto bus 120. Compensation controller 210 for one embodiment may therefore help allow higher bus clock frequencies to be used with reduced or minimized concern for noise on signals associated with faster slew rates.

Figure 4:
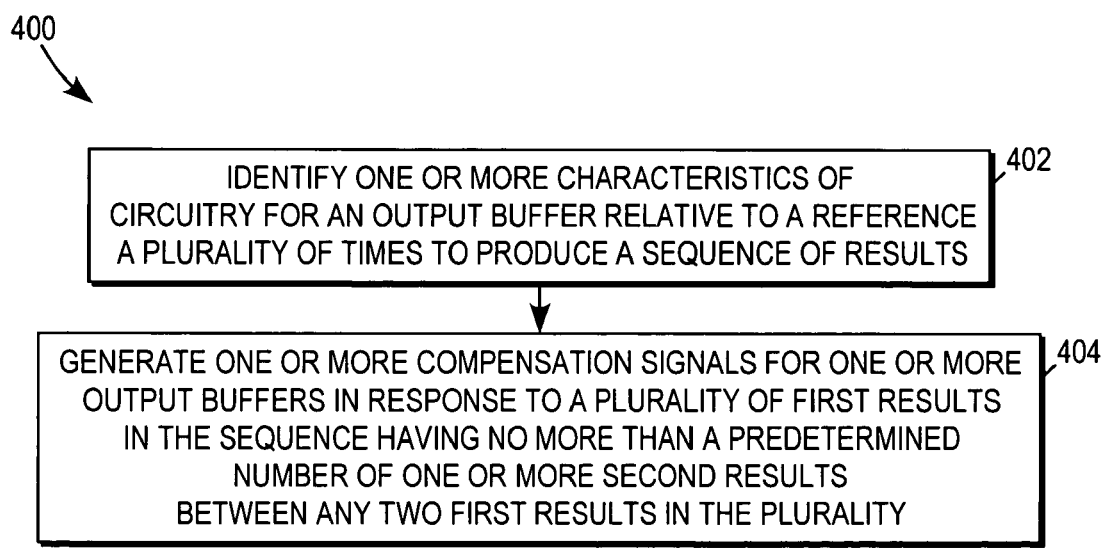
FIG. 4 illustrates, for one embodiment, a flow diagram for output buffer compensation control.

Compensation controller 210 for one embodiment may perform output buffer compensation control in accordance with a flow diagram 400 of FIG. 4.

For block 402 of FIG. 4, compensation controller 210 identifies one or more characteristics of circuitry for an output buffer relative to a reference a plurality of times to produce a sequence of results. Compensation controller 210 may identify any suitable one or more characteristics of any suitable circuitry for any suitable output buffer relative to any suitable reference in any suitable manner to produce a sequence of any suitable results.

For block 404, compensation controller 210 generates one or more compensation signals for one or more output buffers in response to a plurality of first results in the sequence having no more than a predetermined number of one or more second results between any two first results in the plurality. Compensation controller 210 may generate any suitable one or more compensation signals for any suitable one or more output buffers in response to a plurality of any suitable first results in the sequence having no more than any suitable predetermined number of any suitable one or more second results between any two first results in the plurality. Compensation controller 210 for one embodiment may generate one or more compensation signals for one or more output buffers in response to a plurality of first results satisfying one or more conditions and having no more than a predetermined number of one or more second results different than the first results between any two first results in the plurality. Compensation controller 210 for one embodiment may generate one or more compensation signals for one or more output buffers in response to a plurality of first results of a same value having no more than a predetermined number of one or more second results of a different value between any two first results in the plurality. Compensation controller 210 for one embodiment may generate one or more compensation signals in response to a sequence of results identifying the same relative condition despite one or more glitches in the sequence and therefore help better control one or more output buffer characteristics in the presence of noise.

Device 110, 112, 114, 116, and/or 118 for one embodiment may comprise one or more integrated circuits and may or may not be mounted on the same circuit board with any other device 110, 112, 114, 116, and/or 118. Bus 120 may comprise any suitable number of one or more lines at each device 110, 112, 114, 116, and 118 and may be implemented using any suitable communications medium or media. Although illustrated in FIG. 1 as being configured with devices 112, 114, 116, and 118 in a multidrop or multipoint bus configuration to allow devices 110, 112, 114, 116, and/or 118 to communicate with one another over bus 120, device 110 may be configured with any suitable number of one or more devices in any suitable bus configuration.

Compensation Controller

Figure 5:
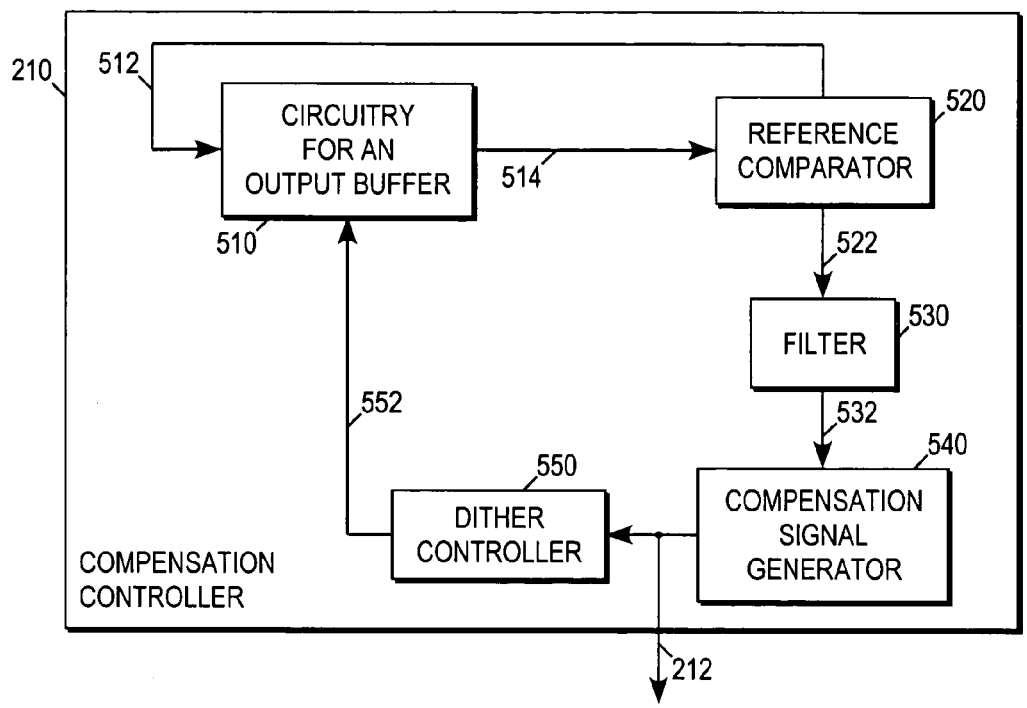
FIG. 5 illustrates, for one embodiment, a block diagram of a compensation controller for the circuitry of FIG. 2.

Compensation controller 210 may comprise any suitable circuitry to perform output buffer compensation control in accordance with flow diagram 300 of FIG. 3 and/or in accordance with flow diagram 400 of FIG. 4. As illustrated in FIG. 5, compensation controller 210 for one embodiment may comprise circuitry for an output buffer 510, a reference comparator 520 to identify one or more characteristics of output buffer circuitry 510 relative to a reference, a filter 530 to help avoid mistakenly compensating one or more characteristics of output buffer circuitry 510 and/or one or more other output buffers exclusive of output buffer circuitry 510 in response to noise in compensation controller 210, a compensation signal generator 540 to generate and output one or more compensation signals for output buffer circuitry 510 and/or one or more other output buffers exclusive of output buffer circuitry 510, and a dither controller 550 to help avoid generating noise resulting from repeatedly generating one or more compensation signals to increase and then decrease a characteristic above and below a desired level.

Output buffer circuitry 510 may comprise any suitable circuitry that may be used for an output buffer. Output buffer circuitry 510 for one embodiment may comprise a dummy output buffer that does not drive any signals onto any line of bus 120 but rather is used by compensation controller 210 to help identify how to control one or more characteristics of one or more output buffers exclusive of output buffer circuitry 510, such as output buffer 221, 222, and/or 223 of FIG. 2 for example. Output buffer circuitry 510 for one embodiment may comprise circuitry for only a portion of an output buffer to help identify how to control one or more characteristics of one or more output buffers exclusive of output buffer circuitry 510.

Output buffer circuitry 510 for another embodiment may comprise an output buffer and may be configured with suitable multiplexing circuitry, for example, to drive data signals, for example, onto a line of bus 120 for device 110 and to be used by compensation controller 210 to help identify how to control one or more characteristics of such output buffer and/or one or more other output buffers, such as output buffer 221, 222, and/or 223 of FIG. 2 for example.

For one embodiment where output buffer circuitry 510 is used by compensation controller 210 to help identify how to control one or more characteristics of one or more output buffers exclusive of output buffer circuitry 510, such as output buffer 221, 222, and/or 223 of FIG. 2 for example, output buffer circuitry 510 for one embodiment may comprise the same, substantially similar, or similar circuitry as such output buffer(s), may comprise a scaled version of the same, substantially similar, or similar circuitry as such output buffer(s), or may comprise the same, substantially similar, or similar circuitry for only a portion of such output buffer(s).

Reference Comparator

Reference comparator 520 generates one or more input signals 512 for output buffer circuitry 510 and is coupled to output input signal(s) 512 to output buffer circuitry 510 and to receive one or more signals 514 from output buffer circuitry 510. Reference comparator 520 may comprise any suitable circuitry to generate any suitable one or more input signals 512 to have output buffer circuitry 510 generate and output any suitable one or more signals 514 and to compare any suitable one or more characteristics of output buffer circuitry 510 based on such signal(s) 514 to any suitable reference a plurality of times to generate and output a sequence of any suitable results identifying how such characteristic(s) compare relative to the reference.

Figure 6:
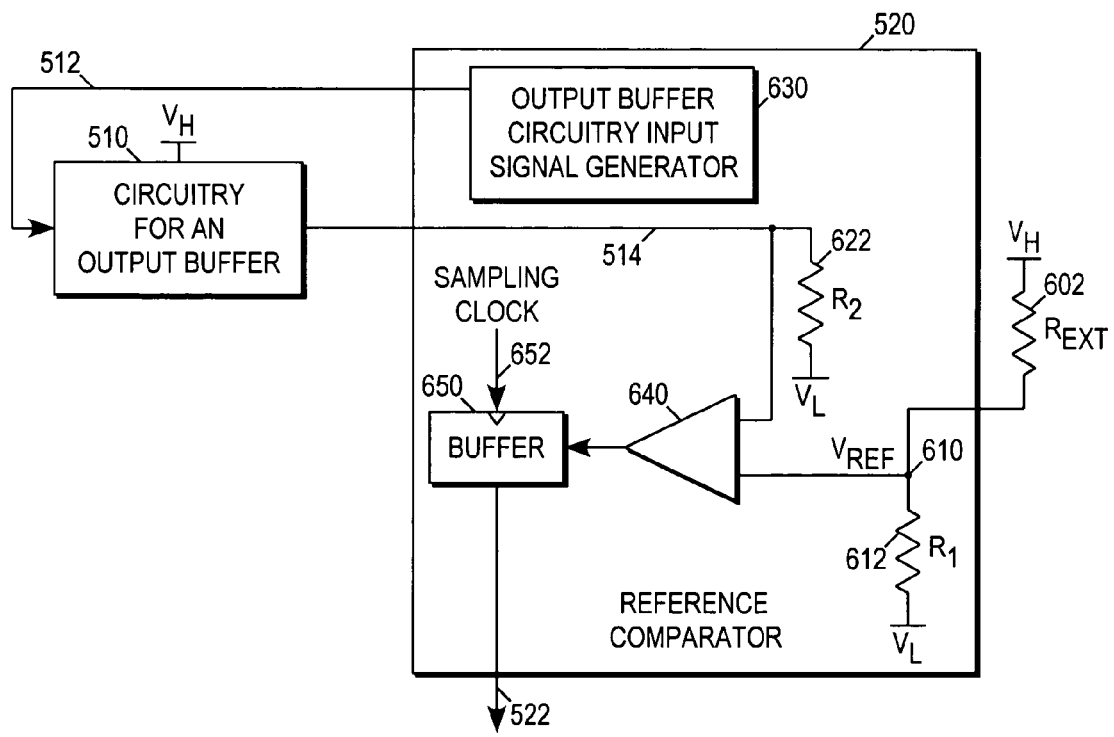
FIG. 6 illustrates, for one embodiment, a diagram of circuitry for a reference comparator of FIG. 5.

Reference comparator 520 for one embodiment may be coupled to receive an output signal on an output node of output buffer circuitry 510 as a signal 514 and compare the voltage level of signal 514 relative to a reference voltage level. As illustrated in FIG. 6, reference comparator 520 for one embodiment may be coupled to any suitable circuitry external to device 110 to implement a resistor 602 having a relatively precise resistance $R_{EXT}$ and may comprise any suitable circuitry to implement a resistor 612 having a resistance $R_1$, a resistor 622 having a resistance $R_2$, an output buffer circuitry input signal generator 630, an analog comparator 640, and a buffer 650.

External resistor 602 and resistor 612 are coupled in series between a higher voltage supply terminal $V_H$, such as a termination voltage supply terminal for example, and a lower voltage supply terminal $V_L$, such as a ground terminal for example, to define a reference voltage signal $V_{REF}$ 610 based on the voltage difference between higher voltage supply terminal $V_H$ and lower voltage supply terminal $V_L$ and based on the resistance $R_{EXT}$ relative to the resistance $R_1$.

Resistor 622 is coupled between an output node of output buffer circuitry 510 and lower voltage supply terminal $V_L$. Because output buffer circuitry 510 is coupled between its same output node and higher voltage supply terminal $V_H$, output buffer circuitry 510 and resistor 622 form a voltage-divider to define a voltage level of signal 514 based on the voltage difference between higher voltage supply terminal $V_H$ and lower voltage supply terminal $V_L$ and based on the resistance of output buffer circuitry 510 relative to the resistance $R_2$.

Output buffer circuitry input signal generator 630 may comprise any suitable circuitry to generate and output any suitable input signal 512 for output buffer circuitry 510 to have output buffer circuitry 510 generate and output any suitable output signal as signal 514. Output buffer circuitry input signal generator 630 for one embodiment may generate a suitable input signal 512 to have output buffer circuitry 510 pull the voltage level of signal 514 toward higher voltage supply terminal $V_H$. In this manner, the resistance of output buffer circuitry 510 between higher voltage supply terminal $V_H$ and its output node for signal 514 is the termination resistance for output buffer circuitry 510.

Analog comparator 640 has one input coupled to receive signal 514 and another input coupled to receive reference voltage signal $V_{REF}$ 610. Analog comparator 640 compares the voltage level of signal 514 to that of reference voltage signal $V_{REF}$ 610 and generates and outputs one or more digital signals identifying whether the voltage level of signal 514 is greater than or less than that of reference voltage signal $V_{REF}$ 610. Analog comparator 640 for one embodiment may output one signal having a first state to identify that the voltage level of signal 514 is greater than, or alternatively greater than or equal to, that of reference voltage signal $V_{REF}$ 610 and a second state to identify that the voltage level of signal 514 is less than, or alternatively less than or equal to, that of reference voltage signal $V_{REF}$ 610. Analog comparator 640 for one embodiment may output two signals with one signal identifying whether the voltage level of signal 514 is greater than, or alternatively greater than or equal to, that of reference voltage signal $V_{REF}$ 610 and the other signal identifying whether the voltage level of signal 514 is less than, or alternatively less than or equal to, that of reference voltage signal $V_{REF}$ 610.

By having the circuitry for external resistor 602 sized with a resistance $R_{EXT}$ relative to the approximate characteristic impedance of one or more lines and by sizing the circuitry for resistors 621 and 622 relative to one another, the resistance of output buffer circuitry 510 may be identified relative to the approximate characteristic impedance of one or more lines based on the comparison of the voltage level of signal 514 to that of reference voltage signal $V_{REF}$ 610.

Buffer 650 is coupled to receive and store the one or more digital signals output from analog comparator 640 and outputs such signals as one or more result signals 522 in response to any suitable sampling clock signal 652. As analog comparator 640 continues to compare the voltage level of signal 514 to that of reference voltage signal $V_{REF}$ 610 and to generate and output one or more digital signals based on the comparison, buffer 650 effectively outputs a sequence of one or more result signals 522 identifying a sequence of results.

Figure 7:
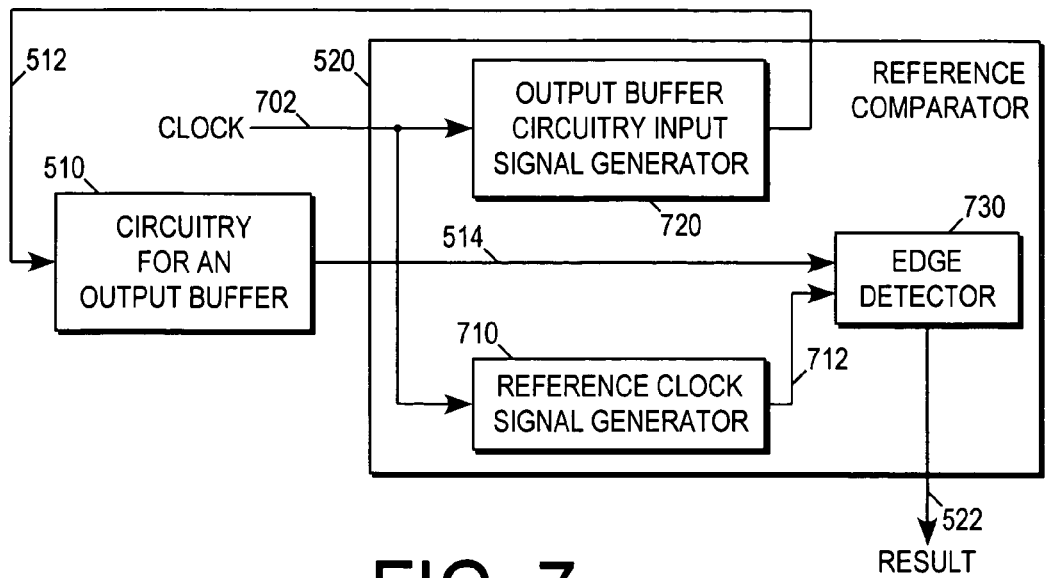
FIG. 7 illustrates, for one embodiment, a block diagram of circuitry for a reference comparator of FIG. 5.

Reference comparator 520 for one embodiment may be coupled to receive an edge cycle completion signal from output buffer circuitry 510 as a signal 514 and compare signal 514 relative to a reference clock signal. As illustrated in FIG. 7, reference comparator 520 for one embodiment may comprise a reference clock signal generator 710, an output buffer circuitry input signal generator 720, and an edge detector 730.

Reference clock signal generator 710 is coupled to receive a clock signal 702 and generates a reference clock signal 712 in response to clock signal 702.

Reference clock signal generator 710 may be coupled to receive any suitable clock signal 702 with any suitable frequency and any suitable duty cycle from any suitable source. Reference clock signal generator 710 for one embodiment may be coupled to receive clock signal 702 with a frequency substantially the same as the bus clock frequency with which device 110 is to drive signals onto one or more lines of bus 120 and with, for example, an approximately 50% duty cycle. Reference clock signal generator 710 for one embodiment may be coupled to receive clock signal 702 from a local clock signal generator for device 110 or from a clock source external to device 110.

Reference clock signal generator 710 may comprise any suitable circuitry to generate and output, in response to clock signal 702, any suitable reference clock signal 712 with any suitable frequency, any suitable duty cycle, and any suitable phase relationship relative to clock signal 702. Reference clock signal generator 710 for one embodiment may invert clock signal 702 to generate reference clock signal 712.

Reference comparator 520 for another embodiment may use clock signal 702 as reference clock signal 712. Reference comparator 520 therefore may not comprise reference clock signal generator 710.

Output buffer circuitry input signal generator 720 is coupled to receive clock signal 702 and generates an input signal 512 for output buffer circuitry 510 in response to clock signal 702. Output buffer circuitry input signal generator 720 may comprise any suitable circuitry to generate and output any suitable input signal 512 for output buffer circuitry 510 in response to clock signal 702.

Output buffer circuitry input signal generator 720 for one embodiment may generate and output output buffer circuitry input signal 512 as a clock signal with any suitable frequency, any suitable duty cycle, and any suitable phase relationship relative to clock signal 702. Output buffer circuitry input signal generator 720 for one embodiment may generate output buffer circuitry input signal 512 as a clock signal with a frequency approximately half as that of clock signal 702 and with an approximately 50% duty cycle. Output buffer circuitry input signal generator 720 for one embodiment may comprise a flip-flop clocked by clock signal 702 and having a non-inverting output terminal coupled to an inverting input terminal of the flip-flop.

Reference comparator 520 for another embodiment may use clock signal 702 as output buffer circuitry input signal 512. Reference comparator 520 therefore may not comprise output buffer circuitry input signal generator 720.

Output buffer circuitry 510 generates the edge cycle completion signal as signal 514 in response to output buffer circuitry input signal 512. Output buffer circuitry 510 may generate any suitable edge cycle completion signal. Output buffer circuitry 510 for one embodiment may generate an edge cycle completion signal to help drive a pre-driver output signal that controls driver circuitry for an output buffer to a voltage level at or near its target voltage level in transitioning from one voltage level to another. Output buffer circuitry 510 for one embodiment may generate an edge cycle completion signal to help provide final, relatively fast transitions for a pre-driver output signal in any suitable manner.

Edge detector 730 detects one or more edges of signal 514 relative to one or more edges of reference clock signal 712 and generates and outputs one or more result signals 522 in response to such detection(s).

Edge detector 730 is coupled to receive signal 514 and reference clock signal 712 and may comprise any suitable circuitry to detect any suitable edge of signal 514 relative to any suitable edge of reference clock signal 712. Edge detector 730 for one embodiment may detect one or more rising edges of signal 514 relative to any suitable edge of reference clock signal 712. Edge detector 730 for one embodiment may detect one or more falling edges of signal 514 relative to any suitable edge of reference clock signal 712. Edge detector 730 for one embodiment may identify whether an edge of signal 514 arrives prior to or after an edge of reference clock signal 712. Because both output buffer circuitry input signal 512 and reference clock signal 712 are generated from clock signal 702, edge detector 730 may identify a delay of output buffer circuitry 510 in generating signal 514 relative to an amount of time defined by clock signal 702. Edge detector 730 may identify or interpret an edge of a signal in any suitable manner.

Edge detector 730 may comprise any suitable circuitry to generate and output any suitable one or more result signals 522 in response to the detection of one or more edges of signal 514 relative to one or more edges of reference clock signal 712. Edge detector 730 for one embodiment may generate one or more result signals 522 to identify whether one or more edges of signal 514 arrive before or after one or more corresponding edges of reference clock signal 712. Edge detector 730 for one embodiment may generate one or more result signals 522 to identify a delay of output buffer circuitry 510 in generating an edge for signal 514 relative to an amount of time defined by clock signal 702.

As edge detector 730 continues to detect one or more edges of signal 514 relative to one or more edges of reference clock signal 712 and to generate and output one or more result signals 522 in response to such detection(s), edge detector 730 effectively generates and outputs a sequence of one or more result signals 522 identifying a sequence of results.

Filter

Filter 530 is coupled to receive a sequence of result signals 522 and may comprise any suitable circuitry to help filter such signals to help avoid mistakenly controlling one or more output buffer characteristics in response to noise in compensation controller 210.

Figure 8:
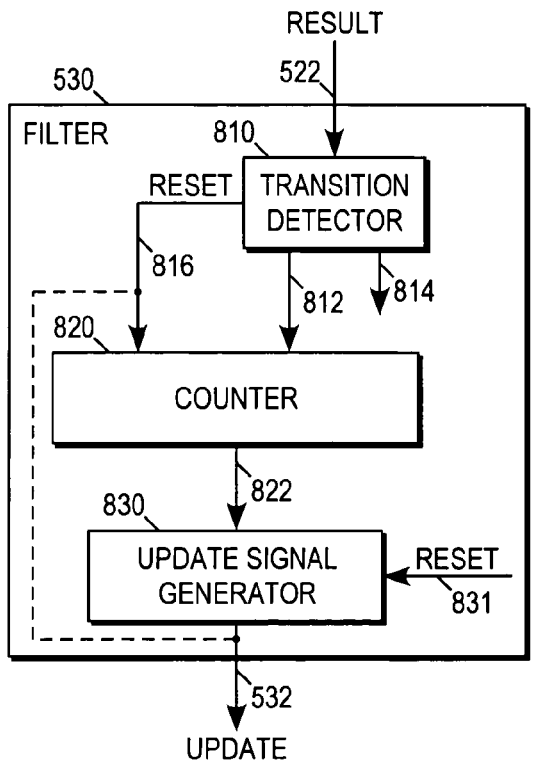
FIG. 8 illustrates, for one embodiment, a block diagram of circuitry for a filter of FIG. 5.

Filter 530 for one embodiment, as illustrated in FIG. 8, may comprise circuitry to implement a transition detector 810, a counter 820, and an update signal generator 830.

Transition detector 810 is coupled to receive the sequence of result signals 522 and may comprise any suitable circuitry to identify in any suitable manner whether received result signals 522 satisfy one or more conditions. Transition detector 810 for one embodiment, as illustrated in FIG. 8, may be coupled to output a suitable counter update signal 812 in response to a received result signal 522. Transition detector 810 for one embodiment may optionally output a received result signal 522 as a signal 814 to identify an update direction for compensation signal generator 540.

Counter 820 is coupled to receive counter update signals 812 and a reset signal 816 and may comprise any suitable circuitry to update a count in any suitable manner in response to counter update signals 812, to reset its count in response to reset signal 816, and to output any suitable one or more signals 822 representative of its count.

Transition detector 810 for one embodiment may generate and output reset signal 816 to reset counter 820 when transition detector 810 identifies one or more result signals 522 that do not satisfy one or more conditions. Transition detector 810 for one embodiment may generate and output reset signal 816 to reset counter 820 when transition detector 810 receives a result signal 522 having a value different than a just prior received result signal 522. In this manner, counter 820 may then count consecutively received result signals 522 having a same value.

Update signal generator 830 is coupled to receive one or more signals 822 from counter 820 and may comprise any suitable circuitry to decode the count maintained by counter 820 in any suitable manner to generate and output any suitable one or more update signals 532 to compensation signal generator 540 when the count satisfies one or more conditions, such as reaching or exceeding a predetermined number for example, to control one or more output buffer characteristics.

For one embodiment where update signal generator 830 generates and outputs one or more update signals 532 when counter 820 counts at least a predetermined number of consecutive result signals 522 having a same value, filter 530 helps avoid mistakenly controlling one or more output buffer characteristics in response to noise in compensation controller 210 by controlling one or more output buffer characteristics in response to at least the predetermined number of consecutive results identifying the same relative condition of one or more output buffer characteristics to help ensure such results were not due to noise. Filter 530 may condition controlling one or more output buffer characteristics in response to any suitable predetermined number, such as thirty-two for example, of consecutive result signals 522 having the same value.

Update signal generator 830 for one embodiment may optionally be coupled to reset counter 820 when the count satisfies one or more conditions, such as reaching or exceeding a predetermined number for example, to restart counting for a next update. For another embodiment, counter 820 may automatically reset its count, for example, by rolling over its count in response to receiving a suitable predetermined number of counter update signals 812, such as thirty-two for example, in the absence of any reset signal 816.

Transition detector 810 for one embodiment may comprise any suitable circuitry to help filter in any suitable manner one or more result signals 522 having a value resulting from noise in compensation controller 210 in an otherwise consecutive sequence of result signals 522 having the same value. In this manner, filter 530 may help better control one or more output buffer characteristics in the presence of noise by controlling one or more output buffer characteristics in response to a sequence of results identifying the same relative condition of one or more output buffer characteristics despite one or more glitches in the sequence.

Transition detector 810 for one embodiment may comprise any suitable circuitry to help identify in the sequence of result signals 522 a plurality of first result signals 522 having no more than a predetermined number of one or more second result signals 522 between any two first result signals in the plurality. Transition detector 810 for one embodiment may comprise any suitable circuitry to help identify in the sequence of result signals 522 a plurality of first result signals 522 satisfying one or more conditions and having no more than a predetermined number of one or more second result signals 522 different than the first result signals 522 between any two first result signals 522 in the plurality.

Transition detector 810 for one embodiment may comprise any suitable circuitry to help identify in the sequence of result signals 522 a plurality of first result signals 522 of a same value having no more than a predetermined number of one or more second result signals 522 of a different value between any two first result signals 522 in the plurality. Transition detector 810 for one embodiment may ignore such different-valued result signals 522. Transition detector 810 for one embodiment may treat such different-valued result signals 522 as same-valued result signals 522.

Figure 9:
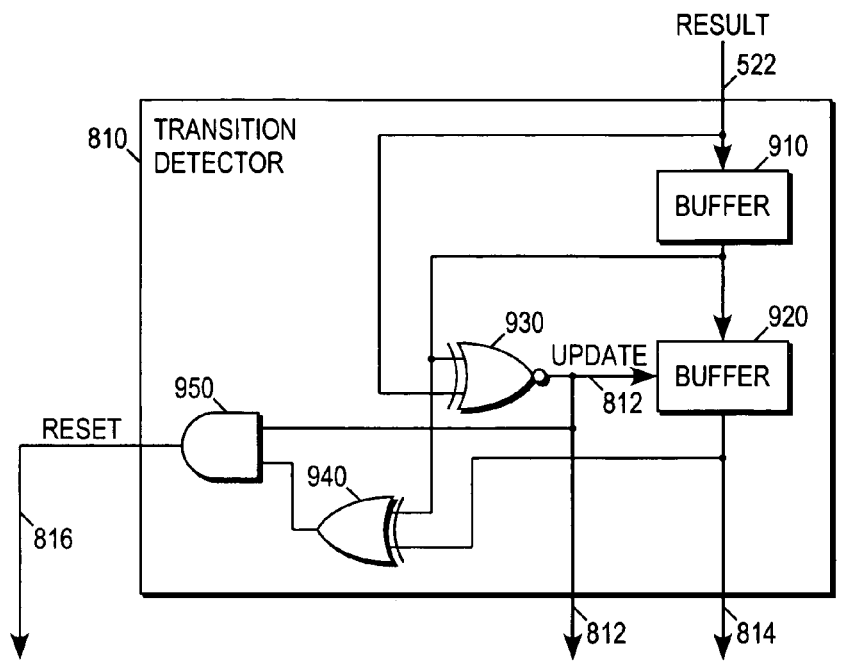
FIG. 9 illustrates, for one embodiment, a block diagram of circuitry for a transition detector of FIG. 8.

Transition detector 810 for one embodiment, as illustrated in FIG. 9, may comprise circuitry to implement buffers 910 and 920, an exclusive-NOR (XNOR) gate 930, an exclusive-OR (XOR) gate 940, and AND gate 950.

Buffer 910 is coupled to receive the sequence of result signals 522 for transition detector 810 and to store and output each such signal to buffer 920. Buffer 920 is coupled to receive and store a result signal 522 from buffer 910 when enabled by counter update signal 812 generated and output from XNOR gate 930. Buffer 920 for one embodiment may output its stored result signal 522 as a signal 814 for transition detector 810. XNOR gate 930 is coupled to receive the result signal 522 newly received by buffer 910 and the result signal 522 stored and output from buffer 910 and generates and outputs counter update signal 812 when both such signals are the same. Buffer 920 therefore only receives and stores a result signal 522 having the same value as the next result signal 522 in the received sequence, and counter 820 is also only updated in response to a result signal 522 having the same value as the next result signal 522 in the received sequence. When the result signal 522 newly received by buffer 910 and the result signal 522 stored and output from buffer 910 have a different value, the result signal 522 stored and output from buffer 910 is not stored by buffer 920 and counter 820 is not updated.

When buffer 910 receives two consecutive result signals 522 having the same value but different from that of the result signal 522 stored in buffer 920, XNOR gate 930, XOR gate 940, and AND gate 950 function to generate and output reset signal 816 to change the value of result signals 522 to be counted by counter 820. XNOR gate 930 outputs counter update signal 812 that identifies whether two consecutive result signals 522 received by buffer 910 have the same value. XOR gate 940 is coupled to receive the result signal 522 stored and output from buffer 910 and the result signal 522 stored and output from buffer 920 and generates and outputs a signal identifying whether such signals have a different value. Because AND gate 950 is coupled to receive the signals output from XNOR gate 930 and XOR gate 940, AND gate 950 generates and outputs reset signal 816 when two consecutive result signals 522 received by buffer 910 have the same value but different from that of the result signal 522 stored in buffer 920.

Figure 10:
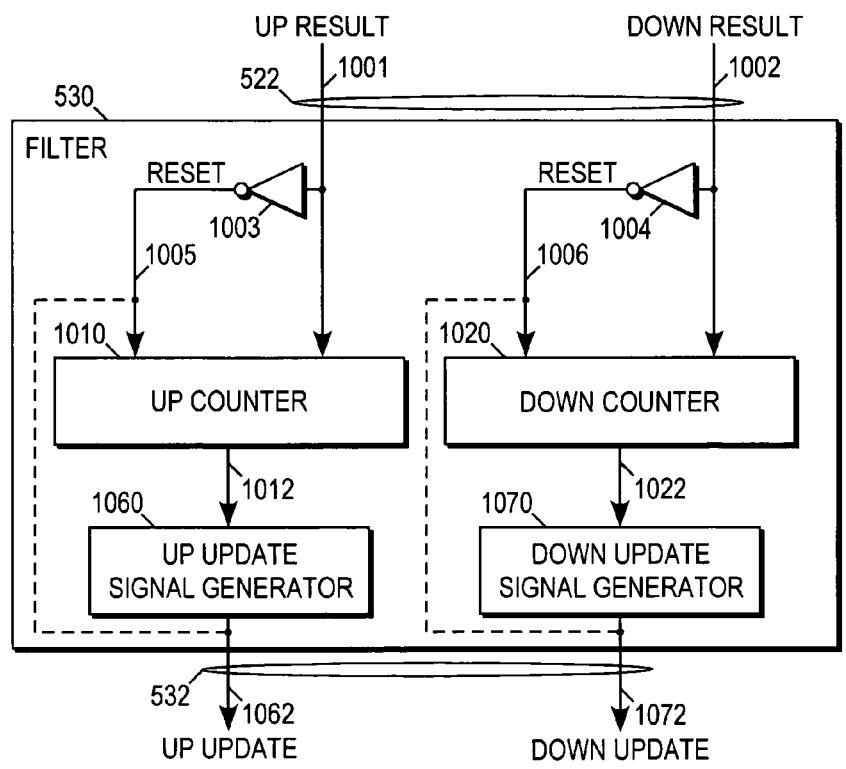
FIG. 10 illustrates, for one embodiment, a block diagram of circuitry for a filter of FIG. 5.

Filter 530 for another embodiment, as illustrated in FIG. 10, may comprise circuitry to implement an inverter 1003, an inverter 1004, an up counter 1010, a down counter 1020, an up update signal generator 1060, and a down update signal generator 1070. For the embodiment of FIG. 10, filter 530 is coupled to receive a sequence of pairs of result signals 522: an up result signal 1001 identifying that one or more output buffer characteristics are to be compensated in an up or increased direction and a down result signal 1002 identifying that one or more buffer characteristics are to be compensated in a down or decreased direction. For one embodiment, up result signals 1001 and down result signals 1002 are mutually exclusive.

Up counter 1010 is coupled to receive a sequence of up result signals 1001 and a reset signal 1005. Up counter 1010 may comprise any suitable circuitry to update a count in any suitable manner in response to active up result signals 1001, to reset its count in response to reset signal 1005, and to output any suitable one or more signals 1012 representative of its count. Inverter 1003 is also coupled to receive the sequence of up result signals 1001 and inverts any inactive up result signals 1001 to generate reset signal 1005. Up counter 1010 therefore counts consecutive active up result signals 1001 in the sequence.

Down counter 1020 is coupled to receive a sequence of down result signals 1002 and a reset signal 1006. Down counter 1020 may comprise any suitable circuitry to update a count in any suitable manner in response to active down result signals 1002, to reset its count in response to reset signal 1006, and to output any suitable one or more signals 1022 representative of its count. Inverter 1004 is also coupled to receive the sequence of down result signals 1002 and inverts any inactive down result signals 1002 to generate reset signal 1006. Down counter 1020 therefore counts consecutive active down result signals 1002 in the sequence.

Up update signal generator 1060 is coupled to receive one or more signals 1012 from up counter 1010 and may comprise any suitable circuitry to decode the count maintained by up counter 1010 in any suitable manner to generate and output any suitable one or more up update signals 1062 of one or more pairs of update signals 532 to compensation signal generator 540 when the count satisfies one or more conditions, such as reaching or exceeding a predetermined number for example, to control one or more output buffer characteristics.

For one embodiment where up update signal generator 1060 generates and outputs one or more up update signals 1062 when up counter 1010 counts at least a predetermined number of consecutive active up result signals 1001, filter 530 helps avoid mistakenly controlling one or more output buffer characteristics in response to noise in compensation controller 210 by controlling one or more output buffer characteristics in response to at least the predetermined number of consecutive active up results identifying the same relative condition of one or more output buffer characteristics to help ensure such active up results were not due to noise. Filter 530 may condition controlling one or more output buffer characteristics in response to any suitable predetermined number, such as thirty-two for example, of consecutive active up result signals 1001.

Up update signal generator 1060 for one embodiment may optionally be coupled to reset up counter 1010 when the count satisfies one or more conditions, such as reaching or exceeding a predetermined number for example, to restart counting for a next update. For another embodiment, up counter 1010 may automatically reset its count, for example, by rolling over its count in response to receiving a suitable predetermined number of active up result signals 1001, such as thirty-two for example.

Down update signal generator 1070 is coupled to receive one or more signals 1022 from down counter 1020 and may comprise any suitable circuitry to decode the count maintained by down counter 1020 in any suitable manner to generate and output any suitable one or more down update signals 1072 of one or more pairs of update signals 532 to compensation signal generator 540 when the count satisfies one or more conditions, such as reaching or exceeding a predetermined number for example, to control one or more output buffer characteristics.

For one embodiment where down update signal generator 1070 generates and outputs one or more down update signals 1072 when down counter 1020 counts at least a predetermined number of consecutive active down result signals 1002, filter 530 helps avoid mistakenly controlling one or more output buffer characteristics in response to noise in compensation controller 210 by controlling one or more output buffer characteristics in response to at least the predetermined number of consecutive active down results identifying the same relative condition of one or more output buffer characteristics to help ensure such active down results were not due to noise. Filter 530 may condition controlling one or more output buffer characteristics in response to any suitable predetermined number, such as thirty-two for example, of consecutive active down result signals 1002.

Down update signal generator 1070 for one embodiment may optionally be coupled to reset down counter 1020 when the count satisfies one or more conditions, such as reaching or exceeding a predetermined number for example, to restart counting for a next update. For another embodiment, down counter 1020 may automatically reset its count, for example, by rolling over its count in response to receiving a suitable predetermined number of active down result signals 1002, such as thirty-two for example.

Although described as using inverters 1003 and 1004 to help count consecutive active up result signals 1001 and down result signals 1002, respectively, filter 530 of FIG. 10 for another embodiment may comprise any other suitable circuitry to help filter up result signals 1001 and down result signals 1002 to help avoid mistakenly controlling one or more output buffer characteristics in response to noise in compensation controller 210. Filter 530 of FIG. 10 for one embodiment may comprise any suitable circuitry to help identify in the sequence of up result signals 1001 a plurality of first up result signals 1001 having no more than a predetermined number of one or more second up result signals 1001 between any two first up result signals 1001 in the plurality and to help identify in the sequence of down result signals 1002 a plurality of down result signals 1002 having no more than a predetermined number of one or more second down result signals 1002 between any two first down result signals 1002 in the plurality.

Compensation Signal Generator and Dither Controller

Compensation signal generator 540 of FIG. 5 is coupled to receive one or more update signals 532 and may comprise any suitable circuitry to generate and output any suitable one or more compensation signals 212 in any suitable manner in response to update signal(s) 532 to control any suitable one or more output buffer characteristics in any suitable manner.

Figure 11:
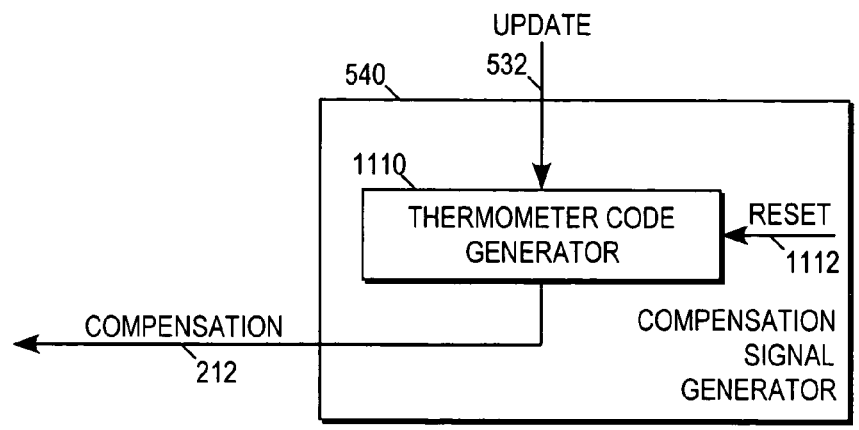
FIG. 11 illustrates, for one embodiment, a block diagram of circuitry for a compensation signal generator of FIG. 5.

Compensation signal generator 540 for one embodiment, as illustrated in FIG. 11, may comprise a thermometer code generator 1110 coupled to receive one or more update signals 532 to generate and output a thermometer code of any suitable number of bits. Thermometer code generator 1110 for one embodiment may store a current thermometer code. In response to one or more update signals 532 to increase one or more output buffer characteristics, thermometer code generator 1110 may shift the stored thermometer code by any suitable number of one or more bits, such as one for example, so as to generate an updated thermometer code that would increase one or more output buffer characteristics. In response to one or more update signals 532 to decrease one or more output buffer characteristics, thermometer code generator 1110 may shift the stored thermometer code by any suitable number of one or more bits, such as one for example, so as to generate an updated thermometer code that would decrease one or more output buffer characteristics.

Thermometer code generator 1110 for one embodiment is coupled to receive a reset signal 1112 and may comprise any suitable circuitry to be initialized or reset to any suitable predetermined thermometer code in response to reset signal 1112.

Figure 12:
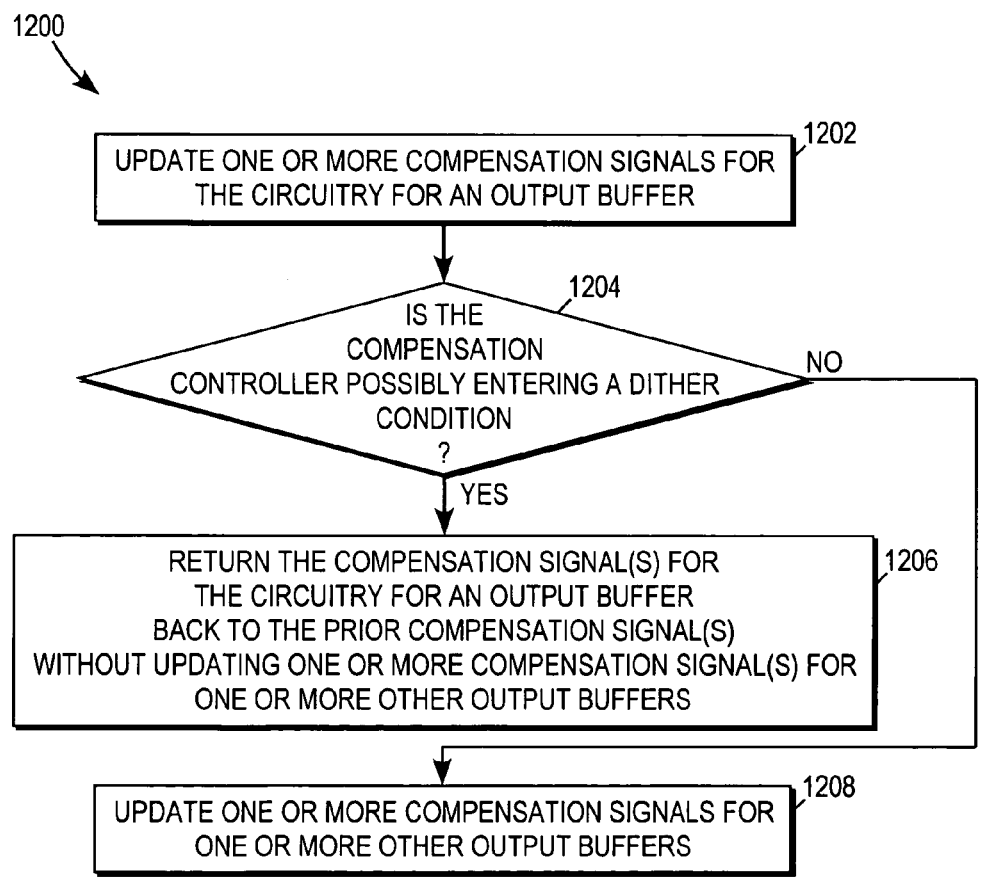
FIG. 12 illustrates, for one embodiment, a flow diagram for dither control.

Dither controller 550 of FIG. 5 is coupled to receive one or more compensation signals 212 from compensation signal generator 540 and may comprise any suitable circuitry to generate and output any suitable one or more compensation signals 552 to control any suitable one or more characteristics of output buffer circuitry 510. Dither controller 550 helps avoid generating noise resulting from repeatedly generating one or more compensation signals to increase and then decrease one or more output buffer characteristics above and below a desired level. Dither controller 550 for one embodiment may comprise any suitable circuitry to help avoid dither in accordance with a flow diagram 1200 of FIG. 12.

For block 1202, dither controller 550 updates one or more compensation signals 552 for output buffer circuitry 510. Dither controller 550 for one embodiment updates one or more compensation signals 552 in accordance with an anticipated update of one or more compensation signals 212 for one or more other output buffers exclusive of output buffer circuitry 510. Dither controller 550 updates one or more compensation signals 552 for output buffer circuitry 510 to help identify whether compensation controller 210 is possibly entering a dither condition. If compensation controller 210 may be entering a dither condition for block 1204, dither controller 550 for one embodiment for block 1206 may then return to using the prior compensation signal(s) 552 without an update of one or more compensation signals 212. If compensation controller 210 is not entering a dither condition for block 1204, dither controller 550 for one embodiment for block 1208 may then continue using the updated compensation signal(s) 552 while compensation signal(s) 212 are updated.

For one embodiment where compensation controller 210 does not comprise dither controller 550, compensation signal generator 540 may output one or more compensation signals 212 to control one or more characteristics of output buffer circuitry 510.

Figure 13:
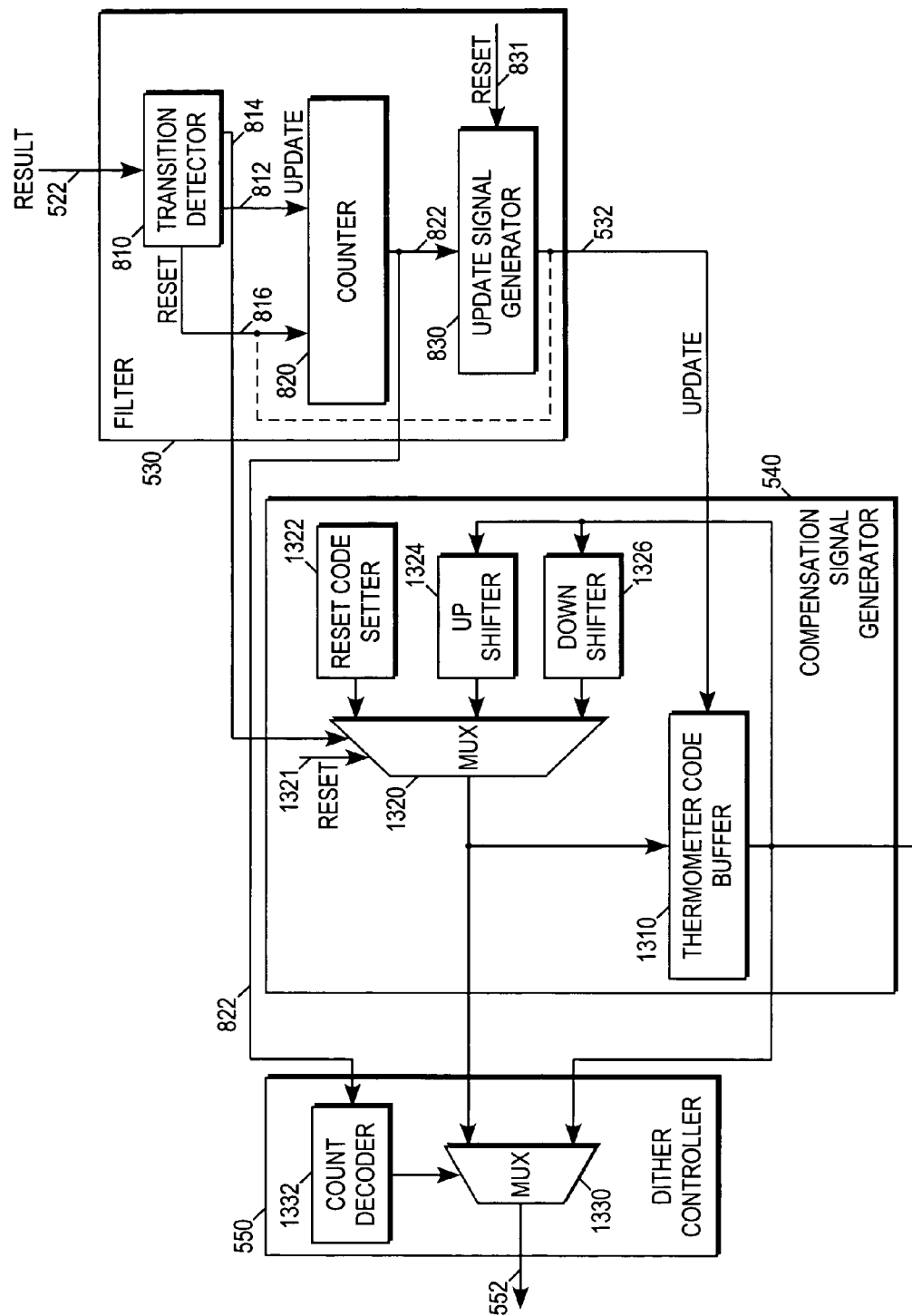
FIG. 13 illustrates, for one embodiment, a block diagram of circuitry for a filter, compensation signal generator, and dither controller of FIG. 5.

For one embodiment where filter 530 comprises circuitry as illustrated in FIG. 13, compensation signal generator 540 for one embodiment, as illustrated in FIG. 13, may comprise circuitry to implement a thermometer code buffer 1310, a multiplexer or MUX 1320, a reset code setter 1322, an up shifter 1324, and a down shifter 1326.

Thermometer code buffer 1310 stores a thermometer code for output from compensation signal generator 540 as compensation signals 212. Buffer 1310 is coupled to receive an updated thermometer code from an output of MUX 1320 and one or more update signals 532 from filter 530 and is enabled to store and output an updated thermometer code in response to the one or more update signals 532. Buffer 1310 may store a thermometer code of any suitable number of bits.

MUX 1320 for one embodiment may have an input coupled to receive a reset code output from reset code setter 1322 and an input coupled to receive a reset signal 1321 and may output the reset code in response to reset signal 1321. Reset code setter 1322 may comprise any suitable circuitry to output any suitable reset code. Reset code setter 1322 for one embodiment may be hardwired with a reset code. Reset code setter 1322 for another embodiment may comprise a suitable memory device, such as a register for example, that may be programmed with any suitable reset code. The thermometer code of buffer 1310 for one embodiment may be initialized or reset to the reset code in response to update signal generator 830 of filter 530 receiving a reset signal 831 to generate and output one or more update signals 532 to buffer 1310.

For another embodiment, buffer 1310 may comprise suitable circuitry to allow the content of buffer 1310 to be reset to a predetermined value, such as all zeroes for example, to initialize or reset the thermometer code.

MUX 1320 for one embodiment may have an input coupled to receive an updated thermometer code from up shifter 1324 and an input coupled to receive an updated thermometer code from down shifter 1326. Up shifter 1324 is coupled to receive the thermometer code stored and output from buffer 1310 and may comprise any suitable circuitry to shift the thermometer code by any suitable number of one or more bits, such as one for example, so as to produce an updated thermometer code that would increase one or more output buffer characteristics controlled using compensation signals 212. Down shifter 1326 is coupled to receive the thermometer code stored and output from buffer 1310 and may comprise any suitable circuitry to shift the thermometer code by any suitable number of one or more bits, such as one for example, so as to produce an updated thermometer code that would decrease one or more output buffer characteristics controlled using compensation signals 212.

MUX 1320 for one embodiment may have an input coupled to receive a suitable increase/decrease control signal from any suitable source and may output an updated thermometer code from either up shifter 1324 or down shifter 1326 in response to such an increase/decrease control signal. The increase/decrease control signal helps identify whether one or more update signals 532 are to be or were output in response to result signals 522 identifying that one or more characteristics for output buffer circuitry 510 are to be increased or decreased. MUX 1320 for one embodiment may receive signal 814 output from transition detector 810 of filter 530 or a suitable buffered version of signal 814 as an increase/decrease control signal.

For one embodiment where filter 530 and compensation signal generator 540 comprise circuitry as illustrated in FIG. 13, dither controller 550 for one embodiment, as illustrated in FIG. 13, may comprise circuitry to implement a multiplexer or MUX 1330 and a count decoder 1332.

MUX 1330 for one embodiment has an input coupled to receive a current thermometer code output from buffer 1310, an input coupled to receive an updated thermometer code output from MUX 1320, and an input coupled to receive a control signal output from count decoder 1332 to output either the current or updated thermometer code as compensation signals 552 in response to the count decoder control signal.

Count decoder 1332 for one embodiment may be coupled to receive one or more signals 822 output from counter 820 of filter 530 to identify based on such signal(s) 822 whether the thermometer code of buffer 1310 may soon be updated. For one embodiment where update signal generator 830 of filter 530 outputs one or more update signals 532 when the count of counter 820 satisfies one or more conditions, count decoder 1332 for one embodiment may identify whether the count of counter 820 is nearing satisfying one or more conditions by identifying whether the count satisfies another one or more conditions. As one example where update signal generator 830 of filter 530 outputs one or more update signals 532 when the count of counter 820 reaches or exceeds a predetermined number, such as thirty-two for example, count decoder 1332 for one embodiment may identify whether the count of counter 820 is nearing the predetermined number by identifying whether the count has reached or exceeded another predetermined number, such as twenty-eight for example.

MUX 1330 for one embodiment may output the updated thermometer code output from MUX 1320 as compensation signals 552 in response to count decoder 1332 identifying that the thermometer code of buffer 1310 may soon be updated to help identify whether compensation controller 210 is possibly entering a dither condition.

If compensation controller 210 is possibly entering a dither condition, counter 820 for one embodiment will be reset in response to the updating of compensation signals 552 and prior to update signal generator 830 outputting one or more update signals 532 to buffer 1310. The thermometer code of buffer 1310 will therefore not be updated, and MUX 1330 will return to outputting the thermometer code of buffer 1310 as compensation signals 552 in response to count decoder 1332 decoding the reset count.

If compensation controller 210 is not entering a dither condition, counter 820 may continue counting without reset after the updating of compensation signals 552 until update signal generator 830 outputs one or more update signals 532 to buffer 1310 to update the thermometer code of buffer 1310 and therefore update compensation signals 212. MUX 1330 may continue outputting the updated thermometer code from MUX 1320 as compensation signals 552 until count decoder 1332 identifies the count of counter 820 has been reset and then output the already updated thermometer code of buffer 1310 as compensation signals 552, effectively continuing output of the updated compensation signals 552.

Dither controller 550 for another embodiment may be coupled to receive one or more update signals 532, one or more signals 814, and/or one or more signals 822 and may comprise any suitable circuitry to maintain a separate thermometer code for compensation signals 552 and help avoid a dither condition.

Compensation Control

Compensation controller 210 may control any suitable one or more characteristics of any suitable output buffer circuitry 510 and/or any suitable one or more other output buffers exclusive of output buffer circuitry 510, such as one or more of output buffers 221, 222, and 223 of FIG. 2 for example. Output buffer circuitry 510 may comprise any suitable circuitry to help allow any suitable one or more characteristics to be controlled in response to any suitable one or more compensation signals 552. One or more other output buffers may comprise any suitable circuitry to help allow any suitable one or more characteristics to be controlled in response to any suitable one or more compensation signals 212.

Output buffer circuitry 510 and one or more other output buffers for one embodiment may each comprise any suitable circuitry to help allow a termination impedance to be controlled. Output buffer circuitry 510 and one or more other output buffers for one embodiment may each comprise any suitable circuitry to help allow a slew rate to be controlled. Output buffer circuitry 510 and one or more other output buffers for one embodiment may each comprise any suitable circuitry to help allow a rising slew rate to be controlled. Output buffer circuitry 510 and one or more other output buffers for one embodiment may each comprise any suitable circuitry to help allow a falling slew rate to be controlled. Output buffer circuitry 510 and one or more other output buffers for one embodiment may each comprise any suitable circuitry to help allow both a rising slew rate and a falling slew rate to be controlled.

Compensation controller 210 may use any suitable reference comparator 520 to control a termination impedance and/or a slew rate of output buffer circuitry 510 and/or one or more other output buffers. Compensation controller 210 for one embodiment may use reference comparator 520 of FIG. 6, for example, to identify a termination resistance of output buffer circuitry 510 relative to an external resistance to control a termination impedance and/or a slew rate of output buffer circuitry 510 and/or one or more other output buffers. Compensation controller 210 for one embodiment may use reference comparator 520 of FIG. 7, for example, to identify a delay of output buffer circuitry 510 relative to a clock signal to control a termination impedance and/or a slew rate of output buffer circuitry 510 and/or one or more other output buffers.

Compensation controller 210 for one embodiment may use one set of reference comparator 520 of FIG. 6, for example, filter 530, compensation signal generator 540, and dither controller 550 to control a termination impedance of output buffer circuitry 510 and/or one or more other output buffers and may use a separate set of reference comparator 520 of FIG. 7, for example, filter 530, compensation signal generator 540, and dither controller 550 to control a slew rate of output buffer circuitry 510 and/or one or more other output buffers. Compensation controller 210 for one embodiment may use reference comparator 520 of FIG. 7 with one edge detector 730 for rising signal edges and another edge detector 730 for falling signal edges. In this manner, compensation controller 210 may use respective sets of filter 530, compensation signal generator 540, and dither controller 550 to control rising and falling slew rates of output buffer circuitry 510 and/or one or more other output buffers.

In the foregoing description, one or more embodiments of the present invention have been described. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   comparing a characteristic of an output buffer circuitry with a reference a plurality of times to generate a sequence of results;
   updating a count for each first result in the sequence that is not separated from any preceding first result in the sequence by more than a pre-determined number of intervening results that are not the first result; and
   generating at least one compensation signal for an output buffer based on the count.

2. The method of claim 1, wherein the pre-determined number of intervening results is zero such that the count identifies the number of consecutive first results.

3. The method of claim 1, wherein the updating comprises updating a count for a plurality of first results in the sequence having no more than a predetermined number of one or more second results between any two first results in the plurality.

4. The method of claim 1, comprising updating one or more compensation signals for the circuitry for an output buffer to identify whether a dither condition may be entered; and
   wherein the generating comprises updating one or more compensation signals for one or more output buffers if a dither condition will not be entered.

5. The method of claim 1, wherein the identifying comprises identifying a voltage level of an output signal of the circuitry for an output buffer relative to a voltage level of a reference signal.

6. The method of claim 1, wherein the identifying comprises identifying a delay of the circuitry for an output buffer in generating an edge cycle completion signal relative to an amount of time defined by a reference clock signal.

7. A method comprising:
   identifying one or more characteristics of circuitry for an output buffer relative to a reference a plurality of times to produce a sequence of results; and
   generating one or more compensation signals for one or more output buffers in response to a plurality of first results in the sequence having no more than a predetermined number of one or more second results between any two first results in the plurality.

8. The method of claim 7, wherein the identifying comprises identifying a voltage level of an output signal of the circuitry for an output buffer relative to a voltage level of a reference signal.

9. The method of claim 7, wherein the identifying comprises identifying a delay of the circuitry for an output buffer in generating an edge cycle completion signal relative to an amount of time defined by a reference clock signal.

10. An apparatus comprising:
    circuitry for an output buffer;
    a reference comparator to identify one or more characteristics of the circuitry for an output buffer relative to a reference a plurality of times to produce a sequence of results;
    a filter to count each first result in the sequence that is not separated from any preceding first result in the sequence by more than a pre-determined number of intervening results that are not the first result: and
    a compensation signal generator to generate one or more compensation signals for one or more output buffers based on the count.

11. The apparatus of claim 10, wherein the filter counts only consecutive first results.

12. The apparatus of claim 10, wherein the filter counts first results in the sequence having no more than a predetermined number of one or more second results between any two first results in the plurality.

13. The apparatus of claim 10, comprising a dither controller to update one or more compensation signals for the circuitry for an output buffer to identify whether a dither condition may be entered.

14. The apparatus of claim 10, wherein the reference comparator is to identify a voltage level of an output signal of the circuitry for an output buffer relative to a voltage level of a reference signal.

15. The apparatus of claim 10, wherein the reference comparator is to identify a delay of the circuitry for an output buffer in generating an edge cycle completion signal relative to an amount of time defined by a reference clock signal.

16. An apparatus comprising:
circuitry for an output buffer;
a reference comparator to identify one or more characteristics of the circuitry for an output buffer relative to a reference a plurality of times to produce a sequence of results;
a filter to identify a plurality of first results in the sequence having no more than a predetermined number of one or more second results between any two first results in the plurality; and
a compensation signal generator to generate one or more compensation signals for one or more output buffers in response to the identification of the plurality of first results.

17. The apparatus of claim 16, wherein the reference comparator is to identify a voltage level of an output signal of the circuitry for an output buffer relative to a voltage level of a reference signal.

18. The apparatus of claim 16, wherein the reference comparator is to identify a delay of the circuitry for an output buffer in generating an edge cycle completion signal relative to an amount of time defined by a reference clock signal.

19. An apparatus comprising:
means for identifying one or more characteristics of circuitry for an output buffer relative to a reference a plurality of times to produce a sequence of results;
means for counting each first result in the sequence that is not separated from any preceding first result in the sequence by more than a pre-determined number of intervening results that are not the first result; and
means for generating one or more compensation signals for one or more output buffers.

20. The apparatus of claim 19, comprising means for avoiding a dither condition.

21. An apparatus comprising:
means for identifying one or more characteristics of circuitry for an output buffer relative to a reference a plurality of times to produce a sequence of results; and
means for generating one or more compensation signals for one or more output buffers in response to a plurality of first results in the sequence having no more than a predetermined number of one or more second results between any two first results in the plurality.

22. A system comprising:
a bus comprising one or more lines; and
a plurality of devices coupled to the bus, wherein at least one device comprises one or more output buffers to output signals over one or more lines of the bus and a compensation controller to identify one or more characteristics of circuitry for an output buffer relative to a reference a plurality of times to produce a sequence of results and to generate one or more compensation signals for the one or more output buffers based on a count of first results in the sequence having no more than a predetermined number of one or more second results between any two first results in the plurality.

23. The system of claim 22, wherein the compensation controller is to count consecutive results having a same value.

24. The system of claim 22, wherein the compensation controller is to update a count for a plurality of first results in the sequence having no more than a predetermined number of one or more second results between any two first results in the plurality.

25. The system of claim 22, wherein the compensation controller is to help avoid a dither condition.

26. A system comprising:
a bus comprising one or more lines; and
a plurality of devices coupled to the bus, wherein at least one device comprises one or more output buffers to output signals over one or more lines of the bus and a compensation controller to identify one or more characteristics of circuitry for an output buffer relative to a reference a plurality of times to produce a sequence of results and to generate one or more compensation signals for the one or more output buffers in response to a plurality of first results in the sequence having no more than a predetermined number of one or more second results between any two first results in the plurality.

* * * * *

UNITED STATES PATENT AND TRADEMARK OFFICE
CERTIFICATE OF CORRECTION

PATENT NO.         : 7,057,415 B2
APPLICATION NO. : 10/732695
DATED              : June 6, 2006
INVENTOR(S)        : Andrew R. Allen et al.

Page 1 of 1

It is certified that error appears in the above-identified patent and that said Letters Patent is hereby corrected as shown below:

In column 18, line 62, in Claim 10, delete "result:" and insert -- result; --, therefor.

Signed and Sealed this

Seventeenth Day of March, 2009

JOHN DOLL
*Acting Director of the United States Patent and Trademark Office*